US008287942B1

(12) United States Patent
Huang et al.

(10) Patent No.: US 8,287,942 B1
(45) Date of Patent: Oct. 16, 2012

(54) METHOD FOR MANUFACTURE OF SEMICONDUCTOR BEARING THIN FILM MATERIAL

(75) Inventors: Jinman Huang, Fremont, CA (US); Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 914 days.

(21) Appl. No.: 12/237,377

(22) Filed: Sep. 24, 2008

Related U.S. Application Data

(60) Provisional application No. 60/976,406, filed on Sep. 28, 2007.

(51) Int. Cl.
B05D 5/12 (2006.01)
(52) U.S. Cl. ............................................. 427/74
(58) Field of Classification Search .............. 427/74
See application file for complete search history.

(56) References Cited

U.S. PATENT DOCUMENTS

| | | | |
|---|---|---|---|
| 3,520,732 A | 7/1970 | Nakayama et al. |
| 3,975,211 A | 8/1976 | Shirland |
| 4,062,038 A | 12/1977 | Cuomo et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |

(Continued)

FOREIGN PATENT DOCUMENTS

AU 7865198 2/1999

(Continued)

OTHER PUBLICATIONS

International Solar Electric Technology, Inc. (ISET) "Thin Film CIGS", http://www.isetinc.com/cigs.html, Oct. 1, 2008.

(Continued)

*Primary Examiner* — Michael Orlando
(74) *Attorney, Agent, or Firm* — Kilpatrick Townsend & Stockton LLP

(57) ABSTRACT

A method for forming a semiconductor bearing thin film material. The method includes providing a metal precursor and a chalcogene precursor. The method forms a mixture of material comprising the metal precursor, the chalcogene precursor and a solvent material. The mixture of material is deposited overlying a surface region of a substrate member. In a specific embodiment, the method maintains the substrate member including the mixture of material in an inert environment and subjects the mixture of material to a first thermal process to cause a reaction between the metal precursor and the chalcogene material to form a semiconductor metal chalcogenide bearing material overlying the substrate member. The method then performs a second thermal process to remove any residual solvent and forms a substantially pure semiconductor metal chalcogenide thin film material overlying the substrate member.

17 Claims, 9 Drawing Sheets

U.S. PATENT DOCUMENTS

| | | |
|---|---|---|
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A * | 8/2000 | Hashimoto et al. ........... 136/252 |
| 6,127,202 A | 10/2000 | Kapur et al. |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0130890 A1 | 6/2006 | Hantschel et al. |
| 2006/0160261 A1 | 7/2006 | Sheats et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 * | 7/2007 | Van Duren et al. ........... 136/262 |
| 2007/0169810 A1 | 7/2007 | Van Duern et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0032044 A1 | 2/2008 | Kuriyagawa et al. |
| 2008/0041446 A1 | 2/2008 | Wu et al. |

| | | | |
|---|---|---|---|
| 2008/0057616 | A1 | 3/2008 | Robinson et al. |
| 2008/0092945 | A1 | 4/2008 | Munteanu et al. |
| 2008/0092953 | A1 | 4/2008 | Lee |
| 2008/0092954 | A1 | 4/2008 | Choi |
| 2008/0105294 | A1 | 5/2008 | Kushiya et al. |
| 2008/0110491 | A1 | 5/2008 | Buller et al. |
| 2008/0110495 | A1 | 5/2008 | Onodera et al. |
| 2008/0121264 | A1 | 5/2008 | Chen et al. |
| 2008/0121277 | A1 | 5/2008 | Robinson et al. |
| 2008/0210303 | A1 | 9/2008 | Lu et al. |
| 2008/0280030 | A1 | 11/2008 | Van Duren et al. |
| 2009/0021157 | A1 | 1/2009 | Kim et al. |
| 2009/0087940 | A1 | 4/2009 | Kushiya |
| 2009/0087942 | A1 | 4/2009 | Meyers |
| 2009/0145746 | A1 | 6/2009 | Hollars |
| 2009/0217969 | A1 | 9/2009 | Matsushima et al. |
| 2009/0234987 | A1 | 9/2009 | Lee et al. |
| 2009/0235983 | A1 | 9/2009 | Girt et al. |
| 2009/0235987 | A1 | 9/2009 | Akhtar et al. |
| 2009/0293945 | A1 | 12/2009 | Peter |
| 2010/0081230 | A1 | 4/2010 | Lee |
| 2010/0087016 | A1 | 4/2010 | Britt et al. |
| 2010/0087026 | A1 | 4/2010 | Winkeler et al. |
| 2010/0096007 | A1 | 4/2010 | Mattmann et al. |
| 2010/0101648 | A1 | 4/2010 | Morooka et al. |
| 2010/0101649 | A1 | 4/2010 | Huignard et al. |
| 2010/0122726 | A1 | 5/2010 | Lee |
| 2010/0197051 | A1 | 8/2010 | Schlezinger et al. |
| 2010/0210064 | A1 | 8/2010 | Hakuma et al. |
| 2010/0267190 | A1 | 10/2010 | Hakuma et al. |
| 2011/0070682 | A1 | 3/2011 | Wieting |
| 2011/0070683 | A1 | 3/2011 | Wieting |
| 2011/0070684 | A1 | 3/2011 | Wieting |
| 2011/0070685 | A1 | 3/2011 | Wieting |
| 2011/0070686 | A1 | 3/2011 | Wieting |
| 2011/0070687 | A1 | 3/2011 | Wieting |
| 2011/0070688 | A1 | 3/2011 | Wieting |
| 2011/0070689 | A1 | 3/2011 | Wieting |
| 2011/0070690 | A1 | 3/2011 | Wieting |
| 2011/0073181 | A1 | 3/2011 | Wieting |

FOREIGN PATENT DOCUMENTS

| | | |
|---|---|---|
| AU | 2001/40599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005011002 | 2/2005 |
| WO | WO 2006/126598 A1 | 11/2006 |
| WO | WO 2007/022221 A2 | 2/2007 |
| WO | WO 2007/077171 A2 | 7/2007 |
| WO | WO 2008/025326 A2 | 3/2008 |

OTHER PUBLICATIONS

Kapur et al., "Fabrication of Light Weight Flexible CIGS Solar Cells for Space Power Applications", Mat. Res. Soc. Proc. vol. 668, (2001) pp. H3.5.1-H3.5.6, Materials Research Society, Warrendale, PA 15086.

Kapur et al., Non-Vacuum Printing Process for CIGS Solar Cells on Rigid and Flexible Substrates 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of $CuIn_{1-x}Ga_xSe_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Nanoparticle Oxides Precursor Inks for Thin Film Copper Indium Gallium Selenide (CIGS) Solar Cells", Mat. Res. Soc. Proc. vol. 668, (2001) pp. H2.6.1-H2.6.7, Materials Research Society, Warrendale, PA 15086.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Metha et al., "A graded diameter and oriented nanorod-thin film structure for solar cell application: a device proposal", Solar Energy Materials & Solar Cells, 2005, vol. 85, pp. 107-113.

Srikant V., et al., "On the Optical Band Gap of Zinc Oxide", Journal of Applied Physics, vol. 83, No. 10, May 15, 1998, pp. 5447-5451.

Examination Report for PCT Patent Application No. PCT/US2008/0077965, Apr. 8, 2010, 7 pages. IPER.

International Search Report and Written Opinion for PCT Patent Application No. PCT/US2009/058829 mailed on Mar. 11, 2011, 12 pages.

International Search Report and Written Opinion for PCT Patent Application No. PCT/US2009/065351, mailed on Jan. 26, 2010, 13 pages.

International Search Report and Written Opinion for PCT Patent Application No. PCT/US09/59097, mailed on Dec. 23, 2009, 12 pages.

International Search Report and Written Opinion for PCT Patent Application No. PCT/US09/59095, mailed on Dec. 4, 2009, 12 pages.

International Search Report and Written Opinion for PCT Patent Application No. PCT/US08/77965, mailed on Dec. 9, 2008, 8 pages.

International Search Report and Written Opinion for PCT Patent Application No. PCT/US08/78019 mailed on Dec. 8, 2008, 9 pages.

Non-Final Office Action of Sep. 7, 2011 for U.S. Appl. No. 12/237,369, 21 pages.

Notice of Allowance of Sep. 2, 2011 for U.S. Appl. No. 12/953,721, 20 pages.

Notice of Allowance of Aug. 26, 2011 for U.S. Appl. No. 12/953,725, 20 pages.

Notice of Allowance of Aug. 25, 2011 for U.S. Appl. No. 12/953,729, 19 pages.

Non-Final Office Action of Aug. 4, 2011 for U.S. Appl. No. 12/479,409, 39 pages.
Notice of Allowance of Aug. 2, 2011 for U.S. Appl. No. 12/953,716, 18 pages.
Notice of Allowance of Aug. 1, 2011 for U.S. Appl. No. 12/577,132, 34 pages.
Notice of Allowance of Aug. 1, 2011 for U.S. Appl. No. 12/953,701, 18 pages.
Notice of Allowance of Aug. 1, 2011 for U.S. Appl. No. 12/953,708, 17 pages.
Final Office Action of May 31, 2011 for U.S. Appl. No. 12/621,489, 13 pages.
Notice of Allowance of May 25, 2011 for U.S. Appl. No. 12/566,651, 8 pages.
Non-Final Office Action of May 2, 2011 for U.S. Appl. No. 12/953,729, 9 pages.
Non-Final Office Action of May 2, 2011 for U.S. Appl. No. 12/953,725, 9 pages.
Non-Final Office Action of May 2, 2011 for U.S. Appl. No. 12/953,721, 9 pages.
Non-Final Office Action of May 2, 2011 for U.S. Appl. No. 12/953,716, 9 pages.
Non-Final Office Action of May 2, 2011 for U.S. Appl. No. 12/953,708, 9 pages.
Non-Final Office Action of May 2, 2011 for U.S. Appl. No. 12/953,701, 9 pages.
Non-Final Office Action of Apr. 28, 2011 for U.S. Appl. No. 12/237,369, 17 pages.
Notice of Allowance of Apr. 27, 2011 for U.S. Appl. No. 12/564,886, 11 pages.
Notice of Allowance of Apr. 26, 2011 for U.S. Appl. No. 12/564,046, 11 pages.
Notice of Allowance of Apr. 25, 2011 for U.S. Appl. No. 12/563,065, 11 pages.
Notice of Allowance of Apr. 19, 2011 for U.S. Appl. No. 12/567,715, 11 pages.
Notice of Allowance of Apr. 8, 2011 for U.S. Appl. No. 12/953,697, 11 pages.
Notice of Allowance of Apr. 5, 2011 for U.S. Appl. No. 12/953,679, 11 pages.
Notice of Allowance of Apr. 5, 2011 for U.S. Appl. No. 12/953,674, 11 pages.
Final Office Action of Dec. 27, 2010 for U.S. Appl. No. 12/479,409, 26 pages.
Non-Final Office Action of Dec. 17, 2010 for U.S. Appl. No. 12/577,132, 11 pages.
Notice of Allowance of Dec. 14, 2010 for U.S. Appl. No. 12/558,117, 8 pages.
Supplemental Notice of Allowability of Dec. 10, 2010 for U.S. Appl. No. 12/568,641, 3 pages.
Notice of Allowance of Nov. 19, 2010 for U.S. Appl. No. 12/568,641, 6 pages.
Notice of Allowance of Oct. 21, 2010 for U.S. Appl. No. 12/565,735, 4 pages.
Restriction Requirement of Oct. 18, 2010 for U.S. Appl. No. 12/568,641, 4 pages.
Non-Final Office Action of Sep. 28, 2010 for U.S. Appl. No. 12/237,371, 15 pages.
Non-Final Office Action of Sep. 22, 2010 for U.S. Appl. No. 12/621,489, 23 pages.
Notice of Allowance of Aug. 27, 2010 for U.S. Appl. No. 12/509,136, 8 pages.
Non-Final Office Action of Aug. 18, 2010 for U.S. Appl. No. 12/237,369, 17 pages.
Non-Final Office Action of Aug. 5, 2010 for U.S. Appl. No. 12/565,735, 14 pages.
Non-Final Office Action of Jul. 22, 2010 for U.S. Appl. No. 12/479,409, 21 pages.
Non-Final Office Action of May 27, 2010 for U.S. Appl. No. 12/568,641, 10 pages.

* cited by examiner

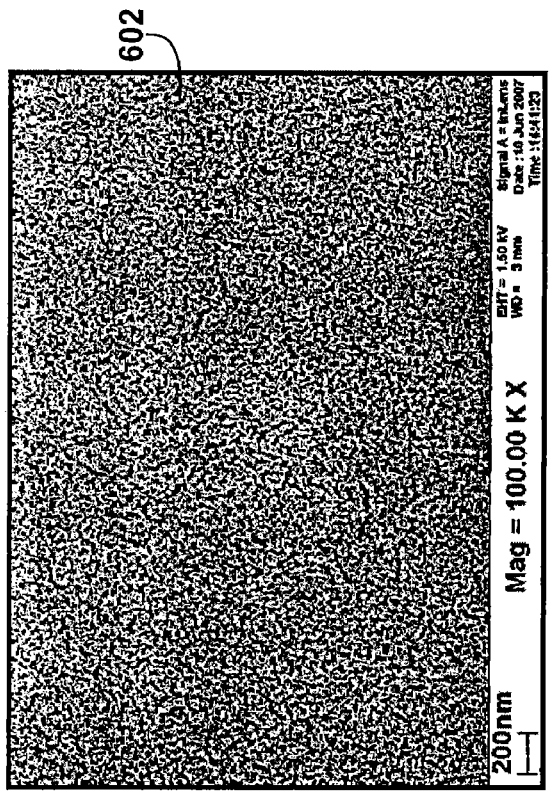
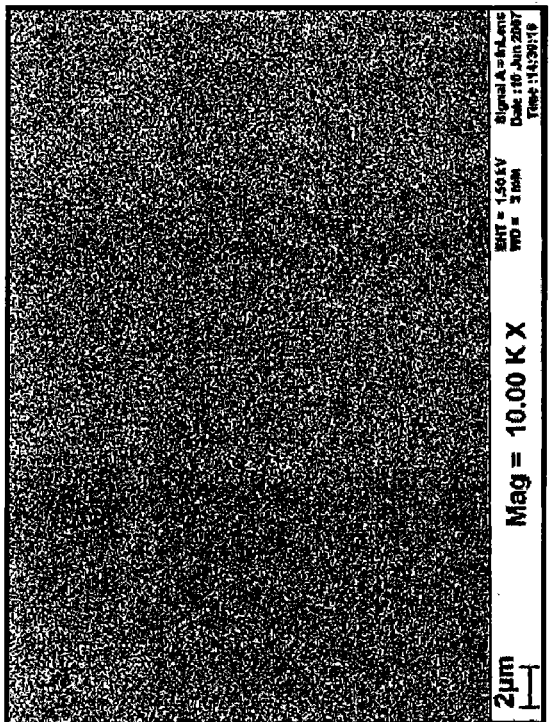
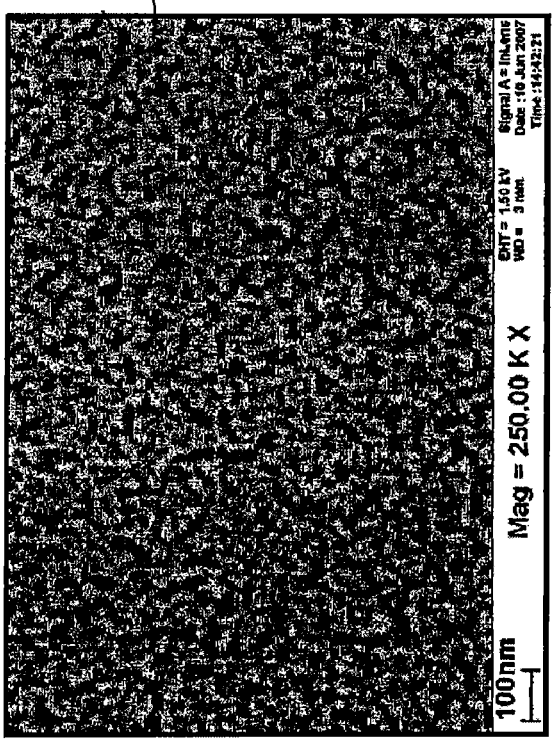
SEM IMAGES of ZnS thin film
FIGURE 6
| Element | Wt % | At% |
|---------|------|-----|
| ZnL | 14.79 | 6.11 |
| S K | 6.13 | 5.17 |
Zn / S = 1.18
FIGURE 7

ZnS thin films by thermal decomposition (n-type)

ZnSe films

METHOD FOR MANUFACTURE OF SEMICONDUCTOR BEARING THIN FILM MATERIAL

CROSS-REFERENCES TO RELATED APPLICATIONS

This application claims priority to provisional patent application Ser. No. 60/976,406; filed on Sep. 28, 2007; commonly assigned, and of which is hereby incorporated by reference for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic materials. More particularly, the present invention provides a method and structure for manufacture of semiconductor materials for photovoltaic applications. Merely by way of example, the present method and structure have been implemented using a zinc sulfide thin film material, but it would be recognized that the invention may be implemented using other materials.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a system for forming thin film semiconductor materials for photovoltaic applications is provided. More particularly, the present invention provides a method and structure for forming semiconductor materials used for the manufacture of photovoltaic devices. Merely by way of example, the method has been used to provide zinc sulfide for photovoltaic application. But it would be recognized that the present invention has a much broader range of applicability, for example, other semiconductor metal chalcogenide materials such as zinc oxide, copper sulfide, copper oxide, zinc selenide, iron sulfide, cadmium sulfide, cadmium selenide, and others may be formed.

In a specific embodiment, a method for forming a semiconductor bearing thin film material includes providing a metal precursor. The method also includes providing a chalcogene precursor. The method forms a mixture of material comprising the metal precursor, the chalcogene precursor and a solvent material. In a specific embodiment, the method deposits the mixture of material overlying a surface region of a substrate member and maintains the substrate member including the mixture of material in an inert environment. The mixture of material is subjected to a first thermal process to form a semiconductor metal chalcogenide bearing thin film material overlying the surface region of the substrate member. The method includes subjecting the substrate member including the semiconductor metal chalcogenide bearing thin film material to a second thermal process to remove organic compounds including residual solvent material to form a substantially pure semiconductor thin film material overlying the surface region of the substrate.

Many benefits are achieved by ways of present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as bandgap, impurity concentration, carrier concentration, doping, resistivity, and others. Additionally, the present method uses environmentally friendly materials that are relatively non-toxic. Depending on the embodiment, one or more of the benefits can be achieved. These and other benefits will be described in more detailed throughout the present specification and particularly below.

BRIEF DESCRIPTION OF THE DRAWINGS

FIGS. 5-13 are simplified diagrams illustrating experimental results according to an embodiment of the present invention.

DETAILED DESCRIPTION OF THE INVENTION

According to embodiments of the present invention, a method and a system for forming semiconductor materials for photovoltaic applications is provided. More particularly, the present invention provides a method and system for processing semiconductor materials used for the manufacture of photovoltaic devices. Merely by way of example, the method has been used to provide a metal chalcogenide thin film material, for example, zinc sulfide bearing thin film material for photovoltaic application. But it would be recognized that the present invention has a much broader range of applicability, for example, embodiments of the present invention may be used to form other metal chalcogenides such as iron sulfide, copper sulfide, zinc selenide, and others, and metal oxides such as zinc oxide, iron oxide, copper oxide, and others.

Figure 1:
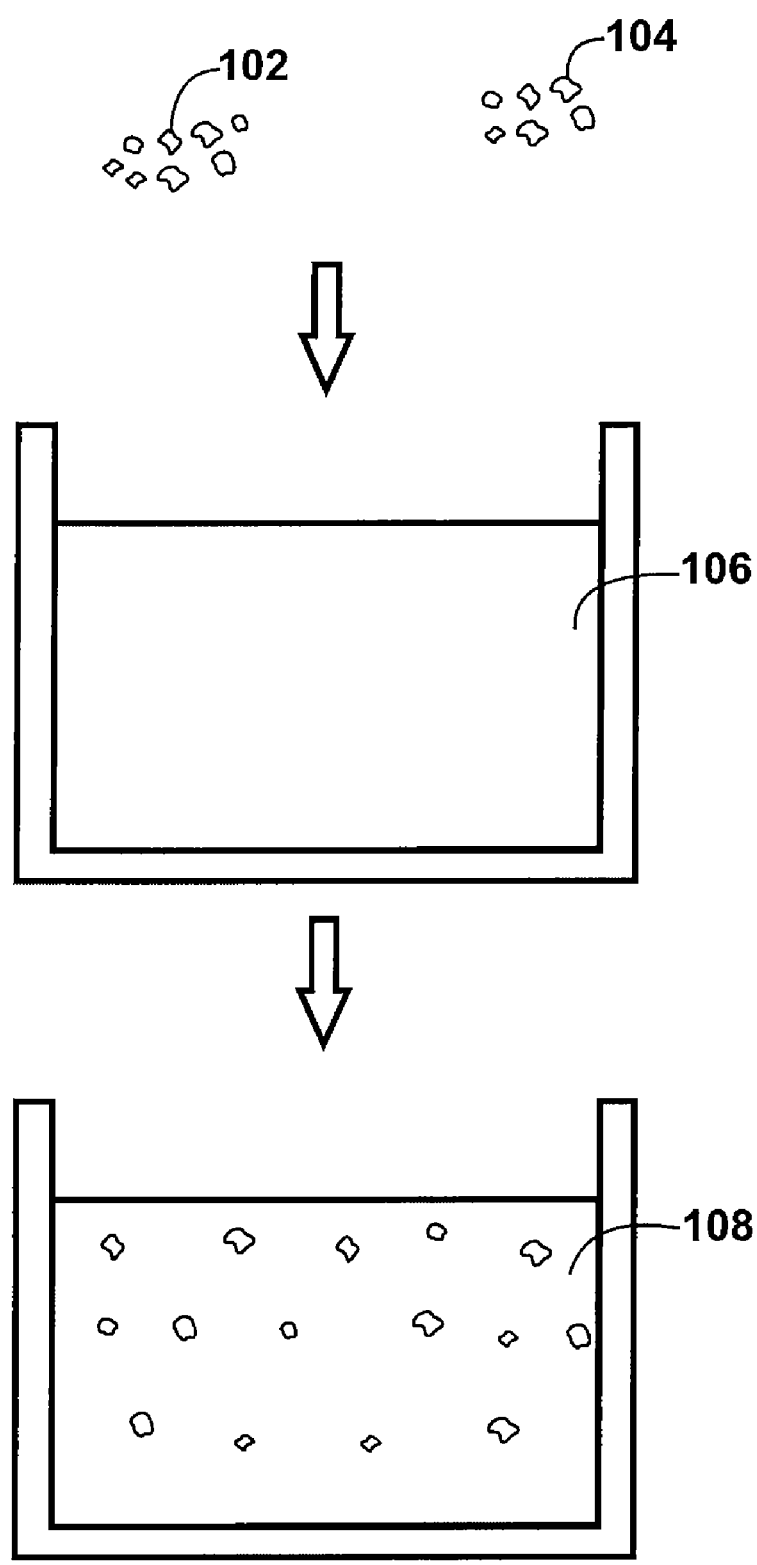
FIG. 1 is a simplified diagram illustrating a method for forming a metal chalcogenide bearing thin film material according to an embodiment of the present invention.

FIG. 1 is a simplified diagram illustrating a method for forming a metal chalcogenide bearing thin film material overlying a substrate according to an embodiment of the present invention. The diagram is merely an example, which should not unduly limit the claims herein. One skilled in the art would recognize other variations, modifications, and alternatives. As shown in FIG. 1, a metal precursor 102 is provided. Also shown in FIG. 1, a chalcogene precursor 104 is provided. The chalcogene precursor can be an organochalcogene compound in a specific embodiment. Other suitable chalcogene precursors may also be used. In a specific embodiment, the metal precursor and the chalcogene precursor are allowed to be dispersed or dissolved in a suitable solvent 106 to form a mixture of material 108. Taking a zinc precursor and a sulfur precursor as an example, the zinc precursor may include zinc acetate, zinc methacrylate, zinc acrylate, zinc acetylacetonate, zinc chloride, zinc nitrate, and others. In a specific embodiment, the sulfur precursor can be an organosulfur compound such as thiourea. Other suitable sulfur precursors may also be used. These other sulfur precursors can include thiols, thioethers, thioacetamides, thiosulfates, and others. In a specific embodiment, the zinc precursor and the sulfur precursor are allowed to be dispersed or dissolved in a suitable solvent to form the mixture of material. The solvent can be ethanol amine, methyloxy ethanol or a combination for zinc acetate and thiourea in a preferred embodiment. Other solvent/solvents may also be used depending on the embodiment.

Figure 2:
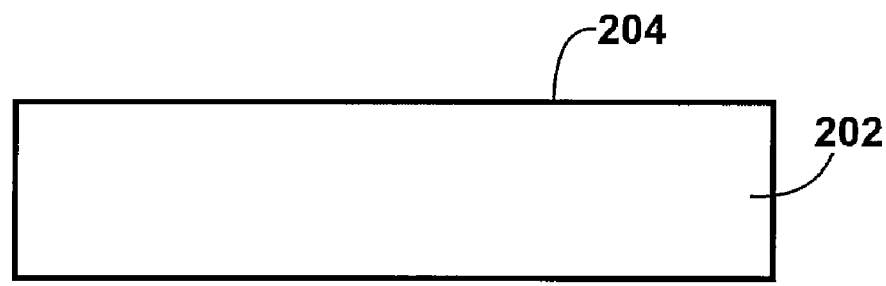
FIG. 2 is a simplified diagram illustrating a substrate member for forming a metal chalcogenide bearing thin film material according to an embodiment of the present invention.

Referring to FIG. 2, the method includes providing a substrate member 202 including a surface region 204 in a specific embodiment. The substrate member may be a transparent substrate such as glass, quartz, fused silica, and others in a specific embodiment. The substrate member may also be a metal material. Examples of the metal material may include stainless steel, aluminum, nickel, and others. Alternatively, the substrate member can be a semiconductor material such as silicon, silicon germanium, germanium, compound III-V semiconductor such as gallium arsenide, II-VI semiconductors and others. Other substrates such as polymers, multilayered materials, and others may also be used. Of course there can be other variations, modifications, and alternatives.

Optionally, the substrate member may be first subjected to a surface treatment process. Such surface treatment process can include a cleaning process to remove contaminants and particulates. For example, the cleaning process may include wet clean using a suitable solvent followed by drying. The wet clean can include wiping the surface of the substrate member using organic solvents such as alcohols (isopropyl alcohol, ethanol, and others) or an acid clean followed by rinsing and drying. A dry cleaning process may also be used depending on the application. Alternatively, the surface of the substrate member may be subjected to a plasma process to clean or to active the surface. Of course there can be other variations, modifications, and alternatives.

Figure 3:
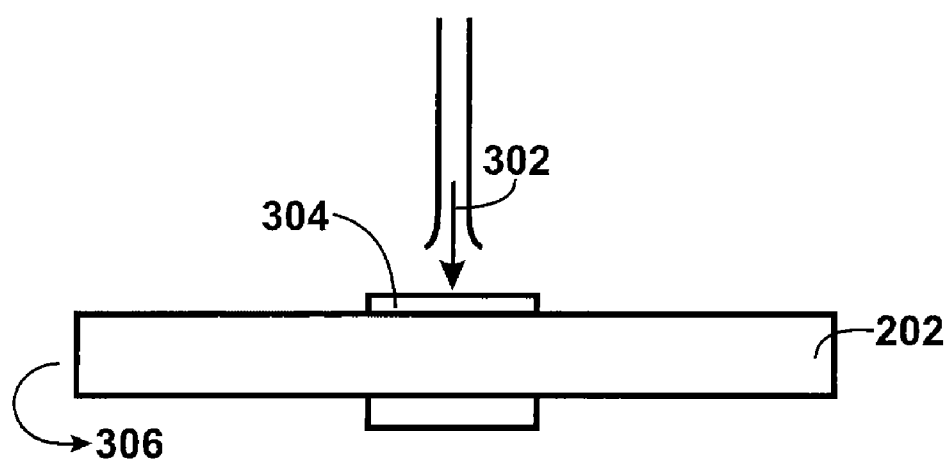
FIG. 3 is a simplified diagram illustrating a system for forming a metal chalcogenide bearing thin film material according to an embodiment of the present invention.
Figure 3:

In a specific embodiment, the mixture of material is dispensed 302 onto a center region 304 of the surface region of the substrate member as shown in FIG. 3. In a specific embodiment, the mixture of material is allowed to distribute over the surface region of the substrate member to form a thickness of material overlying the surface region of the substrate member. As shown, the thickness of material may be formed using a spin coating process 306. The precursor compounds provided in the solvent may also be distributed over the surface region using a doctor blade 308. Alternatively, the mixture of material may be deposited using other solution deposition methods such as a dip coating process, a spraying process, an inkjet process, a screen printing process, and others. Of course one skilled in the art would recognize other variations, modifications, and alternatives.

Figure 4:
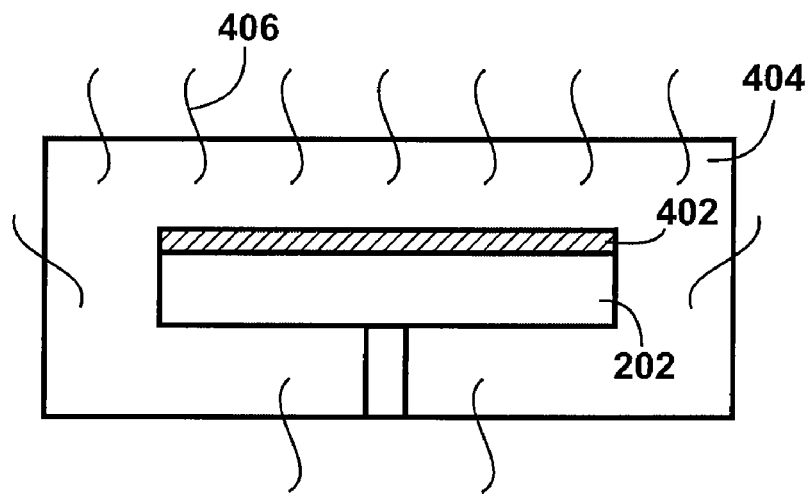
FIG. 4 is a simplified diagram illustrating a method for forming a metal chalcogenide bearing thin film material according to an embodiment of the present invention.
Figure 5:
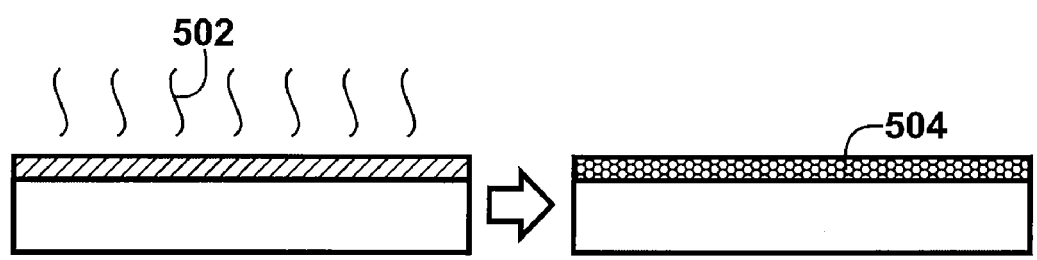

As shown in FIG. 4, the thickness of material 402 comprising the mixture of material is allowed to be evenly formed overlying the substrate member. In a specific embodiment, the substrate member including the thickness of material is maintained in an inert environment 404. The inert environment may be provided using nitrogen, argon, helium and others, depending on the embodiment. In a specific embodiment, the mixture of material is subjected to a first thermal process 406 while being maintained in the inert environment. The first thermal process provides heat energy to allow reaction between the metal precursor and the sulfur precursor to form the metal sulfide in a specific embodiment. Again taking r zinc acetate and thiourea as precursors as an example, the first thermal process is provided at a temperature ranging from about 70 Degree Celsius to about 90 Degree Celsius. Depending on the embodiment, a second thermal process 502 may be provided to remove residual organic compounds including the solvent that may remain after the first thermal process as shown in FIG. 5. For example, the second thermal process is provided at a temperature of about 300 Degree Celsius for organic compounds such as methyloxy ethanol. As shown, a substantially pure metal chalcogenide 504, for example zinc sulfide is formed overlying the surface region of the substrate member after the second thermal process. Of course there can be other variations, modifications, and alternatives.

While the invention has been described using zinc sulfide the method has been used to form other semiconductor thin film metal chalcogenides, for example, zinc selenide (ZnSe) overlying a substrate member. The method includes providing a zinc precursor such as zinc acetate, zinc methacrylate, zinc acrylate, zinc acetylacetonate, zinc chloride, zinc nitrate, and others. The method also provides an organo selenium as a selenium precursor. In a preferred embodiment, the organo selenium can be selenourea. Other selenium precursors may also be used. In a specific embodiment, the zinc precursor and the selenium precursor are added to a suitable solvent to form a solution mixture of precursors. As merely an example, zinc precursor such as zinc acetate and selenium precursor such as selenourea are provided in a solvent comprising methoxyethanol and ethanolamine to form the solution mixture of precursors. The solution mixture of precursors is deposited overlying a surface region of a substrate member using techniques such as spin coating, doctor blade, inkjet, among others. In a specific embodiment, the solution mixture of precursors overlying the substrate member is maintained in an inert environment. The method then provides a first thermal process to allow a reaction between zinc acetate and selenourea to form zinc selenide overlying the substrate member. The method also includes a second thermal process to remove any organic compounds including residual solvents, forming a substantially pure zinc selenide thin film material overlying the substrate member. Of course there can be other variations, modifications, and alternatives.

FIGS. 6-13 are simplified diagrams illustrating experimental results according to an embodiment of the present invention. Referring to FIG. 6, scanning electron microscope (SEM) pictures of a zinc sulfide thin film surface are shown. SEM picture 601 was taken at a magnification of 10,000×, SEM picture 602 was taken at a magnification of 100,000×, and SEM picture 603 was taken at magnification of 250,000×. As shown, the zinc sulfide thin film has a relatively flat surface and an uniform morphology. Of course there can be other variations, modifications, and alternatives.

FIG. 7 is a simplified diagram illustrating elemental composition of a zinc sulfide thin film material deposited on a glass substrate according to an embodiment of the present invention. Elemental composition estimated using Electron dispersion X-ray spectroscopy (EDX) showed that an atomic ratio of Zn to S was approximately 1.18. Of course there can be other variations, modifications, and alternatives.

Figure 8:
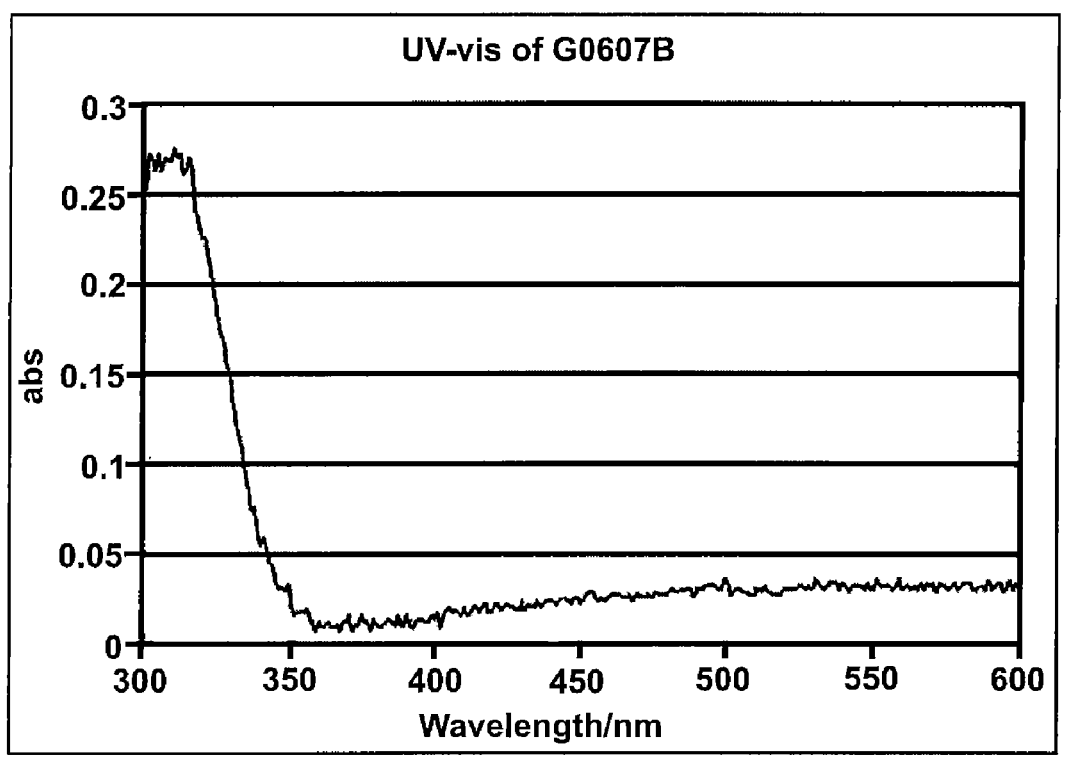
Figure 9:
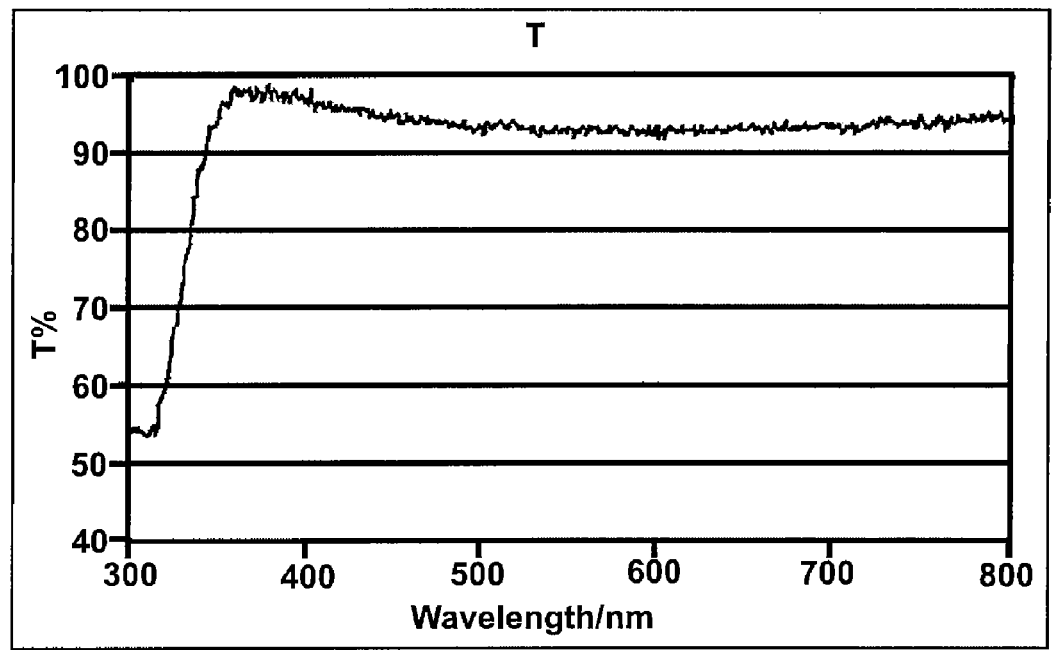

FIG. 8 is a simplified diagram illustrating a UV-VIS absorption spectrum of the zinc sulfide thin film material according to an embodiment of the present invention. A corresponding transmission spectrum is illustrated in FIG. 9. As shown, the film becomes transmissive for wavelengths greater than about 360 nm. Of course there can be other variations, modifications, and alternatives.

Figure 10:
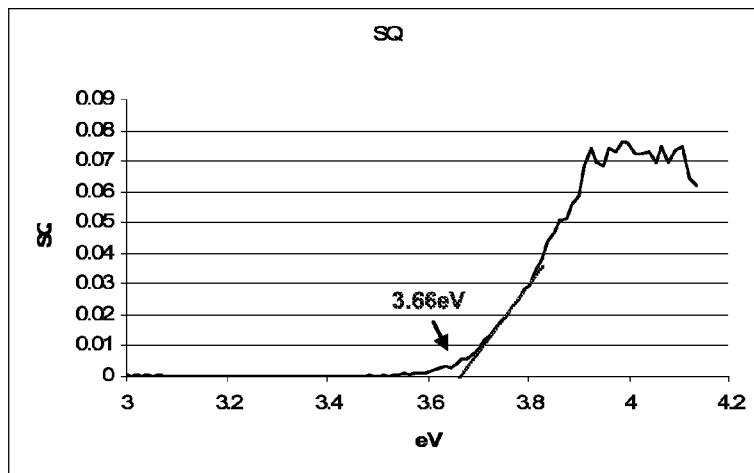
Figure 10:
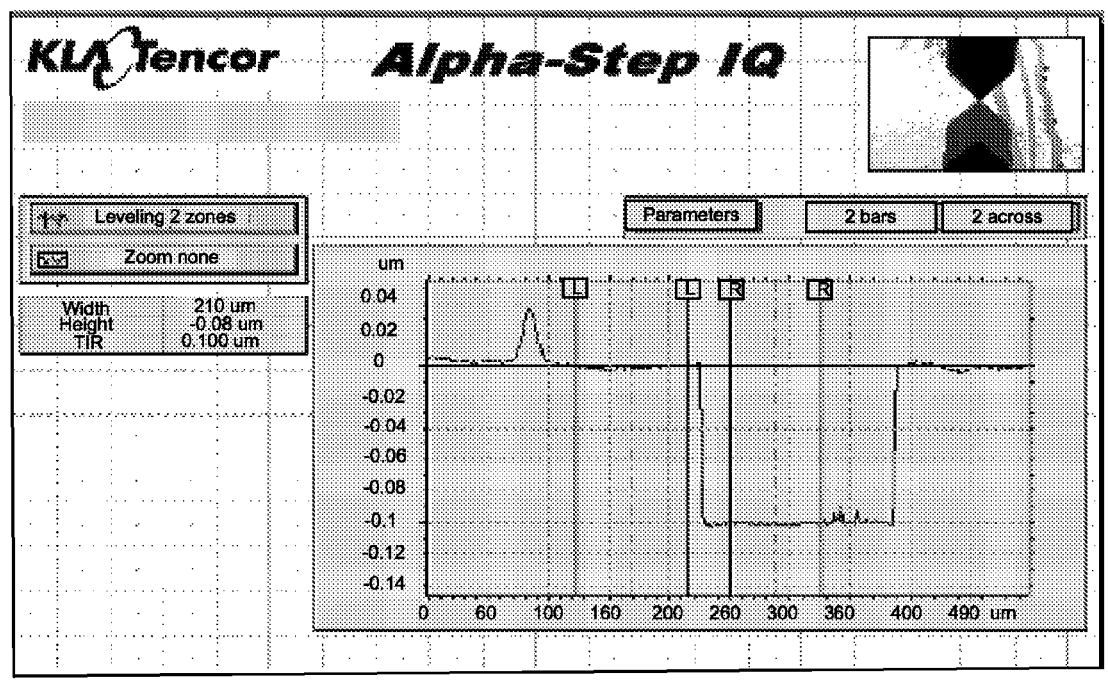

FIG. 10 is a simplified plot of absorbance square as a function of energy in eV for the zinc sulfide thin film material according to an embodiment of the present invention. As shown, a bandgap energy for the zinc sulfide thin film material is about 3.66 eV, which is comparable to bandgap energy of bulk zinc sulfide (3.7 eV). Of course there can be other variations, modifications, and alternatives.

Figure 11:
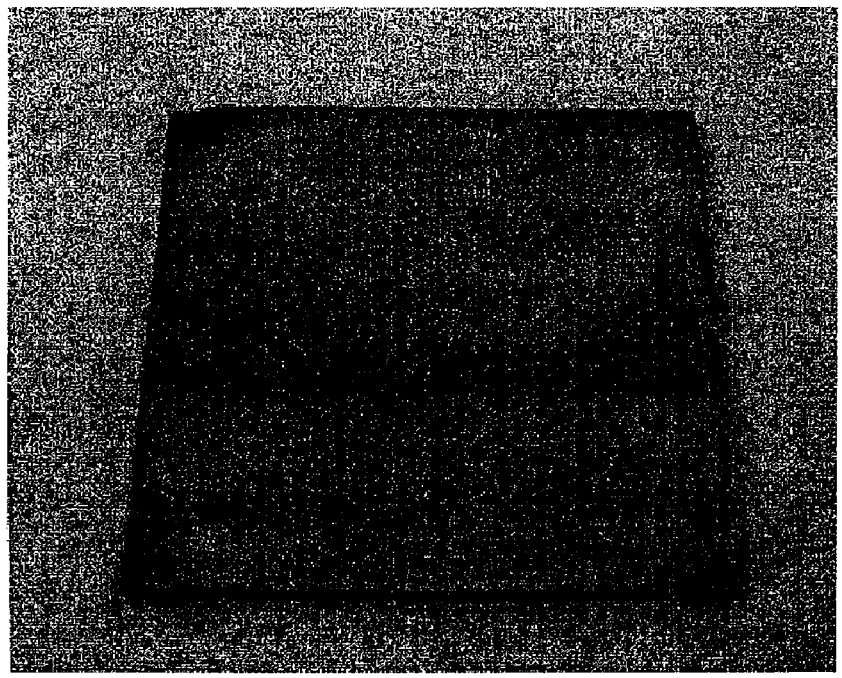
Figure 11:
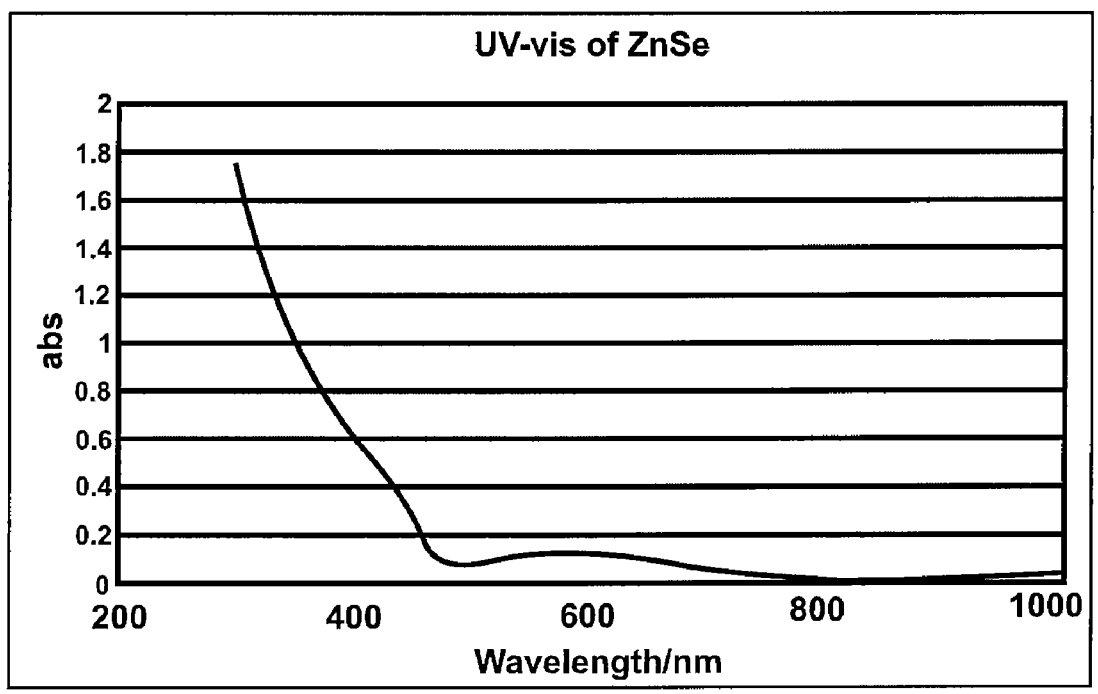
Figure 12:
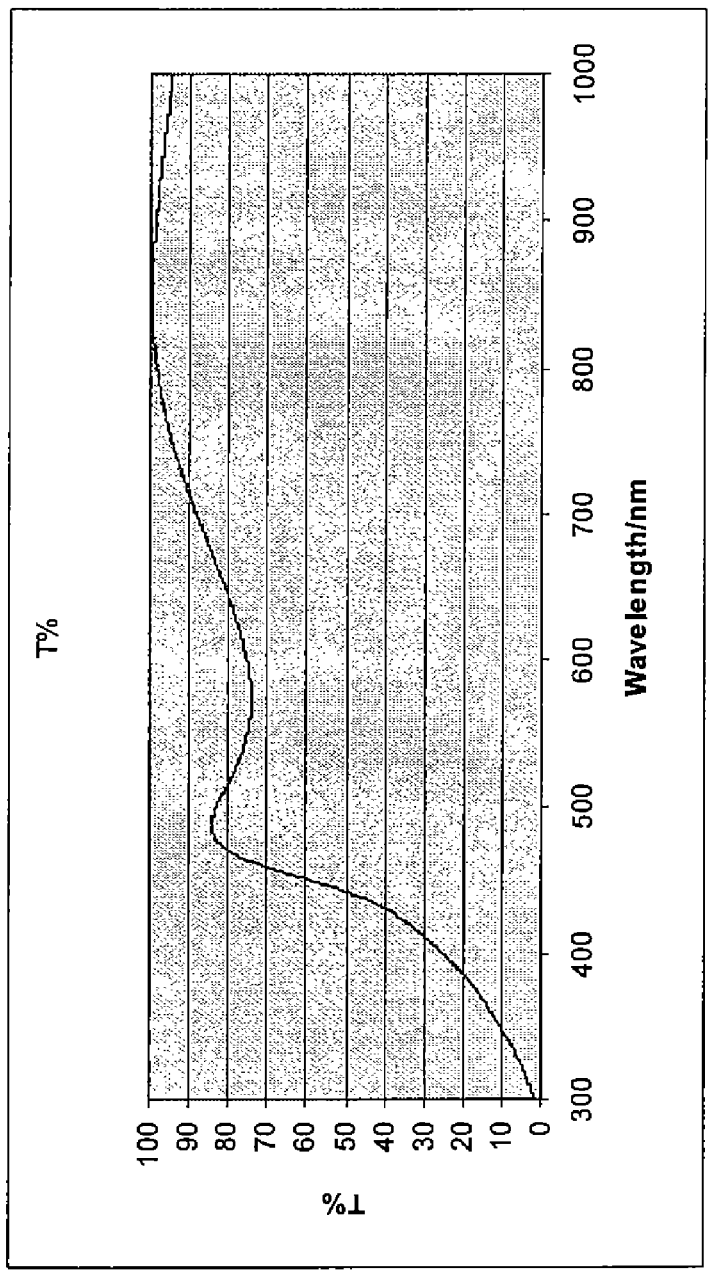

FIG. 11 is a simplified plot of diagram illustrating a UV-VIS absorption spectrum of a zinc selenide thin film material overlying a glass substrate according to an embodiment of the present invention. The corresponding transmission spectrum is illustrated in FIG. 12. As shown, the film becomes transmissive for wavelengths greater than about 480 nm. Of course there can be other variations, modifications, and alternatives.

Figure 13:
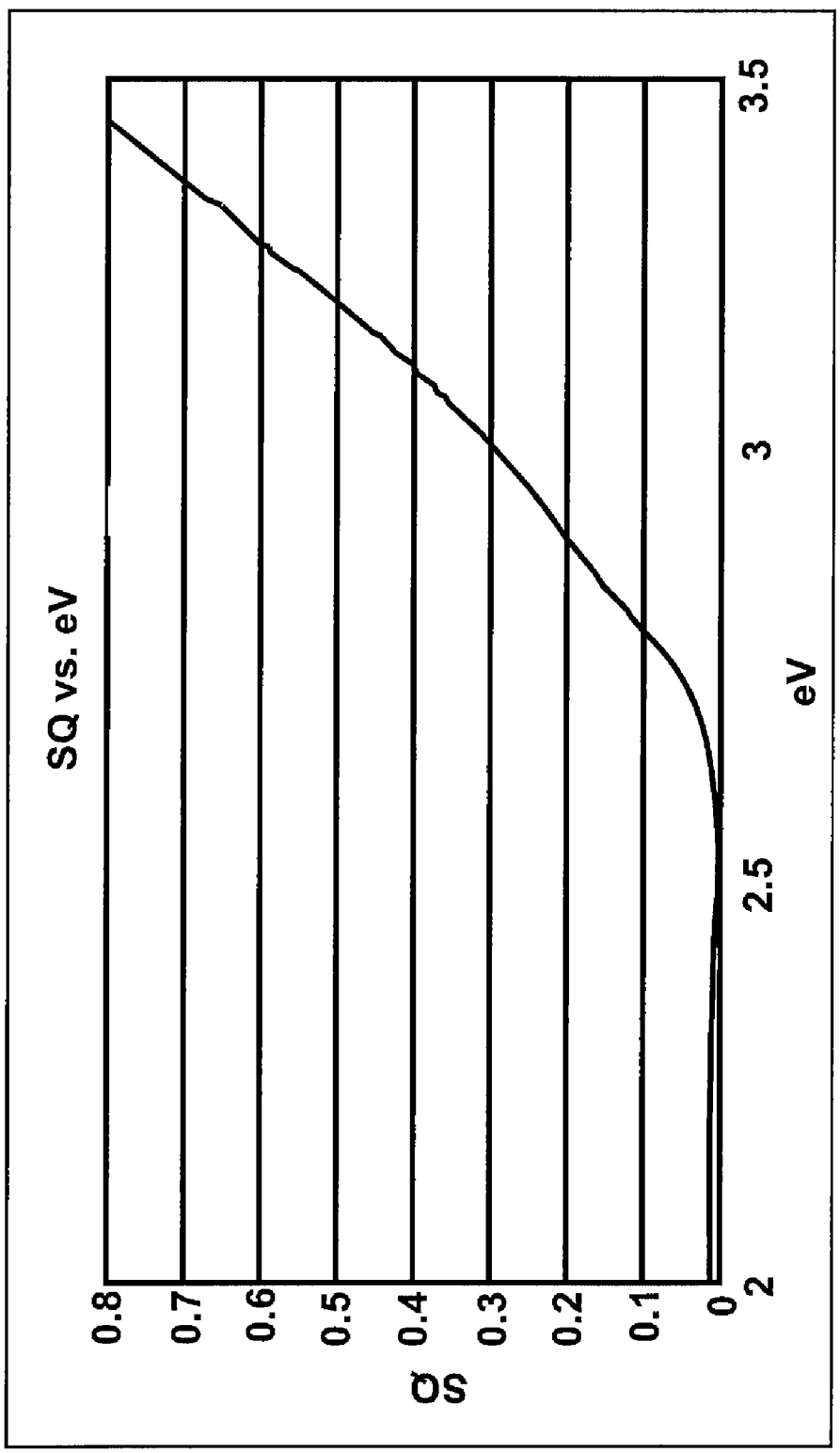

FIG. 13 is a simplified plot of absorbance square as a function of energy in eV for the zinc selenide thin film material according to an embodiment of the present invention. As shown, a bandgap energy for the zinc selenide thin film material is about 2.6 eV. Of course there can be other variations, modifications, and alternatives Although the above has been illustrated according to specific embodiments, there can be other modifications, alternatives, and variations. For example, other metal chalcogenides such as cadmium sulfide, iron sulfide, copper sulfide, cadmium selenide, iron selenide, copper selenide may be formed using suitable respective precursor materials. Additionally, the metal sulfide thin film material may be doped with suitable impurities to have a desired impurity characteristics. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming semiconductor bearing thin film material, the method comprising:
   providing a zinc-containing precursor;
   providing a sulfur-containing precursor;
   forming a mixture of material comprising the zinc-containing precursor, the sulfur-containing precursor and a solvent material;
   depositing the mixture of material overlying a surface region of a substrate member,
   maintaining the substrate member including the mixture of material in an inert environment;
   subjecting the mixture of material to a first thermal process to form a semiconductor zinc-sulfide containing thin film material overlying the surface region of the substrate member; and
   subjecting the semiconductor zinc-sulfide containing thin film material to a second thermal process to form a substantially pure semiconductor thin film material consisting of zinc sulfide, wherein the zinc sulfide comprises a bandgap energy of about 94.6% or greater compared to a bulk zinc sulfide film.

2. The method of claim 1 wherein the solvent material is selected from the group consisting of ethanol, ethanolamine, methoxyethanol, tetrahydrofuran, and ethylene glycol.

3. The method of claim 1 wherein the first thermal process is provided at a temperature ranging from about 80 Degree Celsius to about 90 Degree Celsius.

4. The method of claim 1 wherein the inert environment is provided using nitrogen, argon, or helium.

5. The method of claim 1 wherein the second thermal process is provided at a temperature of about 300 Degree Celsius and higher.

6. The method of claim 1 wherein the depositing step comprises a solution deposition process including a spin on process, a doctor blade process, a dip coating process, a spraying process, an screen printing process, or an inkjet process.

7. The method of claim 1 wherein the substrate member is a transparent substrate.

8. The method of claim 7 wherein the transparent substrate is selected from glass, fused silica, and quartz.

9. The method of claim 1 wherein the substrate member is a metal.

10. The method of claim 9 wherein the substrate member is a metal selected from stainless steel, aluminum, and nickel.

11. The method of claim 1 wherein the substrate member is a semiconductor material selected from silicon, silicon germanium, germanium, II-VI compound semiconductors, III-V compound semiconductors, and silicon on insulator.

12. The method of claim 1 wherein the substrate member is a multilayer material.

13. The method of claim 1 wherein the substrate member is a polymer.

14. The method of claim 1 wherein the zinc precursor is selected from zinc acetate, zinc methacrylate, zinc acrylate, zinc acetylacetonate, zinc chloride, and zinc nitrate.

15. The method of claim 1 wherein the sulfur precursor is selected from thiourea, thiols, thioethers, thioaceamides, and thiosulfates.

16. The method of claim 1 wherein the solvent material comprises methoxyethanol and ethanolamine.

17. The method of claim 1 wherein the zinc sulfide material is characterized by a bandgap of about 3.66 eV.

* * * * *